US012658892B2

(12) United States Patent
Shen et al.

(10) Patent No.: US 12,658,892 B2
(45) Date of Patent: Jun. 16, 2026

(54) MULTI-INDUCTOR COMMON-GROUND ON-CHIP MILLIMETER-WAVE SINGLE-POLE DOUBLE-THROW (SPDT) RF SWITCH

(71) Applicant: NANJING UNIVERSITY OF POSTS AND TELECOMMUNICATIONS, Jiangsu (CN)

(72) Inventors: Guangxu Shen, Jiangsu (CN); Haitao Ma, Jiangsu (CN); Chenyang Zhang, Jiangsu (CN); Ye Han, Jiangsu (CN)

(73) Assignee: NANJING UNIVERSITY OF POSTS AND TELECOMMUNICATIONS, Jiangsu (CN)

( * ) Notice: Subject to any disclaimer, the term of this patent is extended or adjusted under 35 U.S.C. 154(b) by 0 days.

(21) Appl. No.: 18/983,115

(22) Filed: Dec. 16, 2024

(65) Prior Publication Data

US 2025/0119120 A1 Apr. 10, 2025

Related U.S. Application Data

(63) Continuation of application No. PCT/CN2023/132193, filed on Nov. 17, 2023.

(30) Foreign Application Priority Data

Aug. 3, 2023 (CN) .......................... 202310975612.1

(51) Int. Cl.
*H03H 11/28* (2006.01)
*H03K 17/56* (2006.01)

(52) U.S. Cl.
CPC ............. *H03H 11/28* (2013.01); *H03K 17/56* (2013.01)

(58) Field of Classification Search
CPC ........ H03H 11/02; H03H 11/28; H03H 11/30; H03K 17/56; H03K 17/687;
(Continued)

(56) References Cited

U.S. PATENT DOCUMENTS

2019/0140687 A1* 5/2019 Tombak .............. H03K 17/693
2023/0231550 A1 7/2023 Gaynor

FOREIGN PATENT DOCUMENTS

CN 114497928 5/2022
CN 115580282 1/2023
(Continued)

OTHER PUBLICATIONS

Guangxu Shen et al., "Wideband Millimeter-Wave SPST Switch in 100-nm GaN-on-Si Using Strong Mutual Coupling", IEEE Transactions on Circuits and Systems—II: Express Briefs, Jun. 2023, pp. 1891-1895, vol. 70, No. 6.
(Continued)

*Primary Examiner* — Jung Kim
(74) *Attorney, Agent, or Firm* — JCIPRNET

(57) ABSTRACT

A multi-inductor common-ground on-chip millimeter wave single-pole double-throw radio frequency switch is provided. The radio frequency switch includes a first radio frequency port, a second radio frequency port, a third radio frequency port, a first switch arm and a second switch arm. Access points of output matching circuits in the two switch arms are respectively connected with a first compensation inductor and a second compensation inductor. The first compensation inductor, the second compensation inductor, and a first coupling inductor connected with the first radio frequency port are multiplexed to be grounded to a second coupling inductor.

10 Claims, 6 Drawing Sheets

(58) Field of Classification Search
CPC ........... H03K 17/6871; H03K 17/6874; H03K
17/693; H03K 17/735; H04B 1/44; H04B
1/48; H04B 2001/485
See application file for complete search history.

(56) References Cited

FOREIGN PATENT DOCUMENTS

| | | |
|----|-----------|---------|
| CN | 115642909 | 1/2023 |
| CN | 115940910 | 4/2023 |
| CN | 117060912 | 11/2023 |
| WO | 2022088445 | 5/2022 |

OTHER PUBLICATIONS

"International Search Report (Form PCT/ISA/210) of PCT/CN2023/132193", mailed on Apr. 10, 2024, pp. 1-4.
"Written Opinion of the International Searching Authority (Form PCT/ISA/237) of PCT/CN2023/132193", mailed on Apr. 10, 2024, pp. 1-5.

* cited by examiner

MULTI-INDUCTOR COMMON-GROUND ON-CHIP MILLIMETER-WAVE SINGLE-POLE DOUBLE-THROW (SPDT) RF SWITCH

CROSS-REFERENCE TO RELATED APPLICATION

This application is a continuation of international application of PCT application serial no. PCT/CN2023/132193, filed on Nov. 17, 2023, which claims the priority benefit of China application no. 202310975612.1, filed on Aug. 3, 2023. The entirety of each of the above-mentioned patent applications is hereby incorporated by reference herein and made a part of this specification.

TECHNICAL FIELD

The present invention relates to millimeter-wave switch communication chip, radio frequency integrated circuit design technology, and specifically discloses a multi-inductor common-ground on-chip millimeter-wave single-pole double throw (SPDT) RF Switch, which belongs to the technical field of basic electronic circuits.

DESCRIPTION OF RELATED ART

An SPDT RF switch is a control circuit that finds widespread application in the fields of communication, radar, and detection. It is typically a three-port circuit, with one port connected to an antenna, another to the transmit link, and the third to the receive link. The disclosed SPDT switches can be categorized into three types based on their different circuit design principles.

To improve linearity and address the issue of insufficient output power that fails to meet practical application requirements, an RF switch circuit outputs RF signals through series-connected switch units and blocks inactive RF signals to ground via parallel-connected switch units. This increases the isolation of the switch. A feedback unit is used to filter out the harmonic components of the signal, thereby reducing the second and third harmonics generated by the switch itself. This effectively enhances the linearity of the switch, thus achieving the goal of increasing the maximum output power. However, this RF switch has a relatively high insertion loss, making it unsuitable for low-loss circuits.

To meet the demands of broadband millimeter-wave communication systems, an SPDT switch is implemented by paralleling multiple SPST switches. Each SPST switch includes: a first parallel switch transistor and a second parallel switch transistor, a transformer, and a quarter-wavelength transmission line. The switch uses a form of parallel field-effect transistors and coupled transmission lines, while also loading a $\frac{1}{4}\lambda$ transmission line to achieve impedance matching. Although this SPDT switch performs well in terms of bandwidth, the use of $\frac{1}{4}\lambda$ transmission lines means that the switch size cannot be optimized, and the use of coupled lines also increases the insertion loss.

To overcome the shortcomings of existing RF switch circuits, which have poor isolation and linearity at ultra-high frequencies, an SPDT switch adopts a multi-stage series-parallel transistor structure to achieve high isolation. However, this structure has low reusability, and it achieves the desired technical specifications through multi-stage transistor cascading. As a result, the switch cannot balance performance and size, and the switch size is relatively large when achieving a certain level of isolation.

In summary, the existing RF SPDT switches need improvement in the following areas:
(1) Low reusability of components, leading to larger switch chip sizes;
(2) Low reusability of the switch arms when they are open;
(3) Difficulty in achieving both miniaturization and low loss simultaneously The purpose of the present invention is to propose an on-chip switch to overcome the above defects.

SUMMARY

The objective of this invention is to address the shortcomings of the background technology by providing a multi-inductor common-ground on-chip millimeter-wave SPDT RF switch. This aims to solve the technical problem of existing RF SPDT switches, which struggle to achieve both low loss and miniaturization. The invention achieves the goal of reducing the size of the RF switch chip and lowering loss through the efficient reuse of inductor components.

To achieve the above-mentioned invention objectives, the present invention adopts the following technical solutions:

A multi-inductor common-ground on-chip millimeter-wave SPDT RF switch, comprising: First RF port: The first RF port is connected to one end of the input matching circuit, the other end of which is connected to one end of the first coupled inductor. The other end of the first coupled inductor is connected to one end of the second coupled inductor, and the other end of the second coupled inductor is grounded. First switch arm, including: A first transistor of the first switch arm, a first coupling capacitor, a first auxiliary matching circuit, a first compensation inductor, a second transistor of the first switch arm, and a first output matching circuit. The first transistor of the first switch arm, the first coupling capacitor, and the first auxiliary matching circuit are connected in series to form a first series structure. The source of the first transistor of the first switch arm forms the first free end of the first series structure, which serves as the input of the first switch arm and is connected to the connection point between the first coupled inductor and the input matching circuit. The free end of the first auxiliary matching circuit serves as the second free end of the first series structure and is electrically connected to one end of the first output matching circuit, with the other end of the first output matching circuit being the output of the first switch arm. One end of the first compensation inductor is connected to the connection point between the first series structure and the first output matching circuit, while the other end of the first compensation inductor is connected to the connection point between the first coupled inductor and the second coupled inductor. The drain of the second transistor of the first switch arm is connected to the connection point between the first series structure and the first output matching circuit, and the source of the second transistor of the first switch arm is grounded. The gate of the first transistor of the first switch arm is connected to the first DC port of the first switch arm. Second switch arm, including: A first transistor of the second switch arm, a second coupling capacitor, a second auxiliary matching circuit, a second compensation inductor, a second transistor of the second switch arm, and a second output matching circuit. The first transistor of the second switch arm, the second coupling capacitor, and the second auxiliary matching circuit are connected in series to form a second series structure. The drain of the first transistor of the second switch arm serves as the first free end of the second series structure, which serves as the input of the second switch arm and is connected to the connection point between the first coupled inductor and the input matching circuit. The free end of the second auxiliary matching circuit serves as the second free end of the second series structure and is electrically connected to one end of the second output matching circuit, with the other end of the second output matching circuit being the output of the second switch arm. One end of the second compensation inductor is connected to the connection point between the second series structure and the second output matching circuit, while the other end of the second compensation inductor is connected to the connection point between the first coupled inductor and the second coupled inductor. The drain of the second transistor of the second switch arm is connected to the connection point between the second series structure and the second output matching circuit, and the source of the second transistor of the second switch arm is grounded. The gate of the first transistor of the second switch arm is connected to the first DC port of the second switch arm, and the gate of the second transistor of the second switch arm is also connected to the first DC port of the second switch arm. The logic level applied to the first DC port of the first switch arm is opposite to that applied to the second DC port of the first switch arm. The logic level applied to the first DC port of the second switch arm is opposite to that applied to the second DC port of the second switch arm. The logic level applied to the first DC port of the first switch arm is opposite to that applied to the first DC port of the second switch arm. The logic level applied to the second DC port of the first switch arm is opposite to that applied to the second DC port of the second switch arm. Second RF port: The second RF port is connected to the output of the first switch arm. Third RF port: The third RF port is connected to the output of the second switch arm.

As a further optimization of the multi-inductor common-ground on-chip millimeter-wave SPDT RF switch, when the inductance value of the second coupled inductor is 0, the first coupled inductor, the first compensation inductor, and the second compensation inductor are all grounded.

As a further optimization of the multi-inductor common-ground on-chip millimeter-wave SPDT RF switch, the first switch arm also includes a first parallel resonant unit, which consists of a first connection inductor, a third transistor of the first switch arm, and a third compensation inductor. One end of the first connection inductor is connected to the second free end of the first series structure, while the other end of the first connection inductor is connected to one end of the third compensation inductor and the drain of the third transistor of the first switch arm. The other end of the third compensation inductor is connected to the connection point between the first coupled inductor and the second coupled inductor. The source of the third transistor of the first switch arm is grounded, and the gate of the third transistor of the first switch arm is connected to the third DC port of the first switch arm. The logic level applied to the third DC port of the first switch arm is the same as that applied to the second DC port of the first switch arm. The second switch arm includes a second parallel resonant unit that is symmetrically structured to the first parallel resonant unit.

As a further optimization of the multi-inductor common-ground on-chip millimeter-wave SPDT RF switch, the DC ports are connected to a DC bias voltage through gate resistors.

As a further optimization of the multi-inductor common-ground on-chip millimeter-wave SPDT RF switch, the input matching circuit, the first auxiliary matching circuit, the second auxiliary matching circuit, the first output matching circuit, and the second output matching circuit are composed of pure inductors, pure capacitors, or a combination of capacitors and inductors.

As a further optimization of the multi-inductor common-ground on-chip millimeter-wave SPDT RF switch, the transistors are field-effect transistors (FETs), high electron mobility transistors (HEMTs), mHEMTs, or pHEMTs.

As a further optimization of the multi-inductor common-ground on-chip millimeter-wave SPDT RF switch, the first coupled inductor, the second coupled inductor, the first compensation inductor, the second compensation inductor, the third compensation inductor, the first connection inductor, the second connection inductor, the inductors in the input matching circuit, the inductors in the first auxiliary matching circuit, the inductors in the second auxiliary matching circuit, the inductors in the first output matching circuit, and the inductors in the second output matching circuit are microstrip inductors, strip line inductors, or spiral inductors.

As a further optimization of the multi-inductor common-ground on-chip millimeter-wave SPDT RF switch, the grounding of the transistor sources and the coupling inductors is achieved through metallized via holes that are terminated to ground.

A millimeter-wave RF front-end chip, including the aforementioned multi-inductor common-ground on-chip millimeter-wave SPDT RF switch.

The present invention adopts the above technical solutions and has the following beneficial effects:

(1) The proposed SPDT RF switch proposed by this invention includes first and second compensation inductors connected to the connection points of the output matching circuits in the two switch arms. By using the coupled resonance working mode of the transistors in the conducting switch arm, low loss of the switch is achieved. Utilizing the new coupled resonance generated by the disconnected switch arm creates a new transmission pole, thereby achieving a wide bandwidth.

(2) In the proposed SPDT RF switch proposed by this invention, the first and second compensation inductors and the first coupled inductor connected to the first RF port reuse the second coupled inductor that is grounded. This reuse of the coupled inductors achieves miniaturization of the switch.

DESCRIPTION OF THE EMBODIMENTS

The technical scheme of the invention is described in detail below in conjunction with the accompanying drawings.

Figure 5:
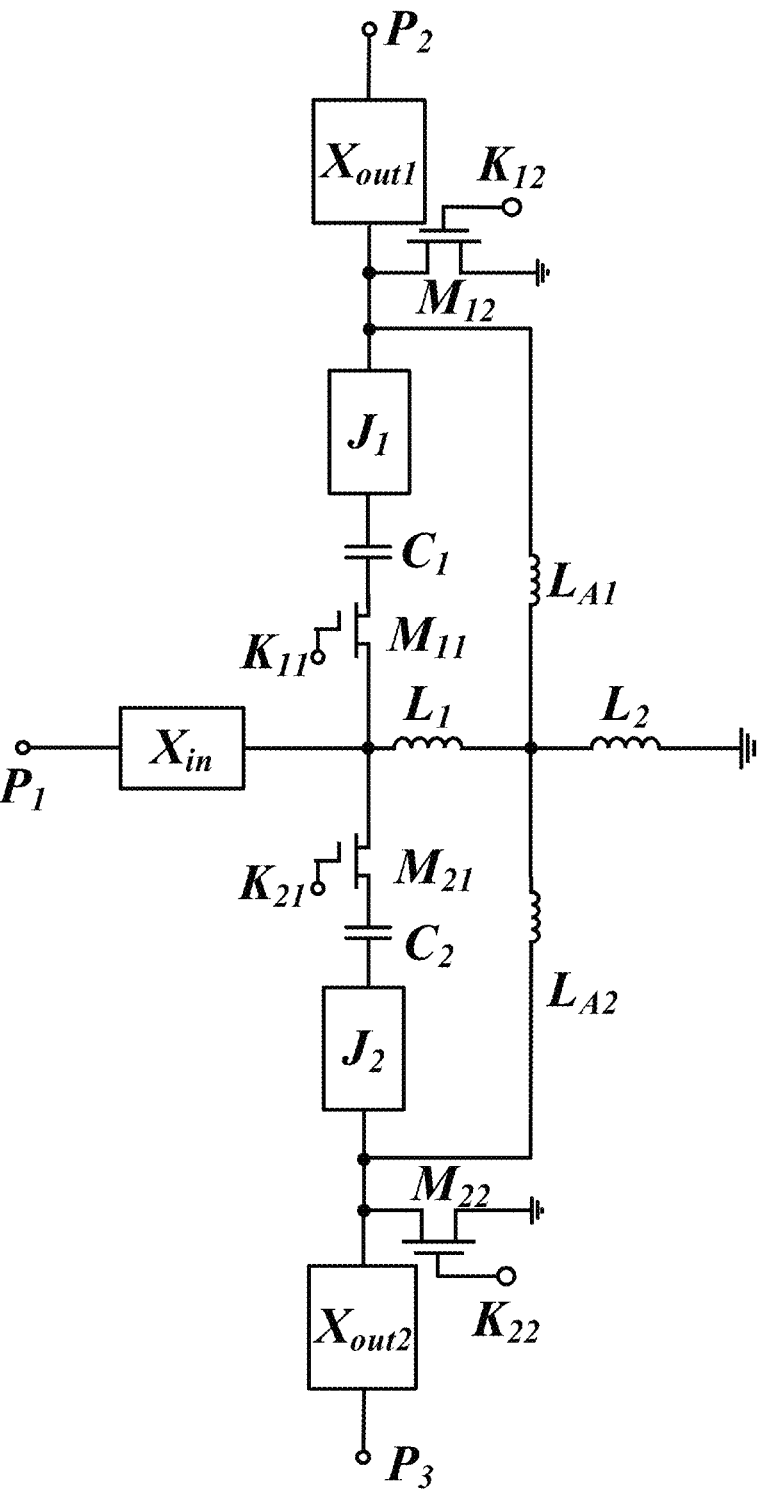
FIG. 5 is a general structural diagram of the present invention.

The general circuit structure of the multi-inductor common-ground on-chip millimeter-wave SPDT RF switch disclosed in this invention is shown in FIG. 5 and includes: a first RF port $P_1$, a second RF port $P_2$, a third RF port $P_3$, a first switch arm, and a second switch arm.

The first RF port $P_1$ is connected to one end of the input matching circuit $X_{in}$, the other end of which is connected to one end of the first coupled inductor $L_1$. The other end of the first coupled inductor $L_1$ is connected to one end of the second coupled inductor $L_2$, and the other end of the second coupled inductor $L_2$ is grounded.

The first switch arm includes: the first transistor $M_{11}$ of the first switch arm, the first coupling capacitor $C_1$, the first auxiliary matching circuit $J_1$, the first compensation inductor $L_{A1}$, the second transistor $M_{12}$ of the first switch arm, and the first output matching circuit $X_{out1}$. The first transistor $M_{11}$ of the first switch arm, the first coupling capacitor $C_1$, and the first auxiliary matching circuit $J_1$ are connected in series to form a first series structure. The source of the first transistor $M_{11}$ of the first switch arm forms the first free end of the first series structure, which serves as the input of the first switch arm and is connected to the connection point between the first coupled inductor $L_1$ and the input matching circuit $X_{in}$. One end of the first auxiliary matching circuit $J_1$ is connected in series with the first coupling capacitor $C_1$, and the other end, which is the free end of the first auxiliary matching circuit $J_1$, serves as the second free end of the first series structure and is electrically connected to one end of the first output matching circuit $X_{out1}$. The other end of the first output matching circuit $X_{out1}$ serves as the output of the first switch arm and is connected to the second RF port $P_2$. One end of the first compensation inductor $L_{A1}$ is connected to the connection point between the first series structure and the first output matching circuit $X_{out1}$, and the other end of the first compensation inductor $L_{A1}$ is connected to the connection point between the first coupled inductor $L_1$ and the second coupled inductor $L_2$. The drain of the second transistor $M_{12}$ of the first switch arm is connected to the connection point between the first series structure and the first output matching circuit $X_{out1}$, and the source of the second transistor $M_{12}$ of the first switch arm is grounded. The gate of the first transistor $M_{11}$ of the first switch arm is connected to the first DC port $K_{11}$ of the first switch arm, and the gate of the second transistor $M_{12}$ of the first switch arm is connected to the second DC port $K_{12}$ of the first switch arm.

The second switch arm includes: the first transistor $M_{21}$ of the second switch arm, the second coupling capacitor $C_2$, the second auxiliary matching circuit $J_2$, the second compensation inductor $L_{A2}$, the second transistor $M_{22}$ of the second switch arm, and the second output matching circuit $X_{out2}$. The first transistor $M_{21}$ of the second switch arm, the second coupling capacitor $C_2$, and the second auxiliary matching circuit $J_2$ are connected in series to form a second series structure. The drain of the first transistor $M_{21}$ of the second switch arm serves as the first free end of the second series structure, which serves as the input of the second switch arm and is connected to the connection point between the first coupled inductor $L_1$ and the input matching circuit $X_{in}$. The free end of the second auxiliary matching circuit $J_2$ serves as the second free end of the second series structure and is electrically connected to one end of the second output matching circuit $X_{out2}$. The other end of the second output matching circuit $X_{out2}$ serves as the output of the second switch arm and is connected to the third RF port $P_3$. One end of the second compensation inductor $L_{A2}$ is connected to the connection point between the second series structure and the second output matching circuit $X_{out2}$, and the other end of the second compensation inductor $L_{A2}$ is connected to the connection point between the first coupled inductor $L_1$ and the second coupled inductor $L_2$. The drain of the second transistor $M_{22}$ of the second switch arm is connected to the connection point between the second series structure and the second output matching circuit $X_{out2}$, and the source of the second transistor $M_{22}$ of the second switch arm is grounded. The gate of the first transistor $M_{21}$ of the second switch arm is connected to the first DC port $K_{21}$ of the second switch arm, and the gate of the second transistor $M_{22}$ of the second switch arm is connected to the second DC port $K_{22}$ of the second switch arm.

The logic level of the first DC port $K_{11}$ of the first switch arm is opposite to that of the second DC port $K_{12}$ of the first switch arm; the logic level of the first DC port $K_{21}$ of the second switch arm is opposite to that of the second DC port $K_{22}$ of the second switch arm; the logic level of the first DC port $K_{11}$ of the first switch arm is opposite to that of the first DC port $K_{21}$ of the second switch arm; and the logic level of the second DC port $K_{12}$ of the first switch arm is opposite to that of the second DC port $K_{22}$ of the second switch arm. For example, when $K_{11}$ is connected to a high logic level, $K_{12}$ to a low logic level, $K_{21}$ to a low logic level, and $K_{22}$ to a high logic level, the first switch arm is turned on, and the second switch arm is turned off. When the first transistor $M_{11}$ of the first switch arm is on, its parasitic inductance resonates with the first coupling capacitor $C_1$ and the first auxiliary matching circuit $J_1$. When the second transistor $M_{12}$ of the first switch arm is off, its parasitic capacitance resonates with the first compensation inductor $L_{A1}$ and the second coupled inductor $L_2$, thereby reducing the switching loss through the coupled resonance working mode. The entire second switch arm resonates with the first coupled inductor $L_1$ and the second coupled inductor $L_2$, generating a new transmission pole by creating a new coupled resonance from the disconnected switch arm. Conversely, when $K_{11}$, $K_{12}$, $K_{21}$, and $K_{22}$ are connected to the opposite logic levels, the first switch arm is turned off, and the second switch arm is turned on.

Embodiment 1

Figure 1:
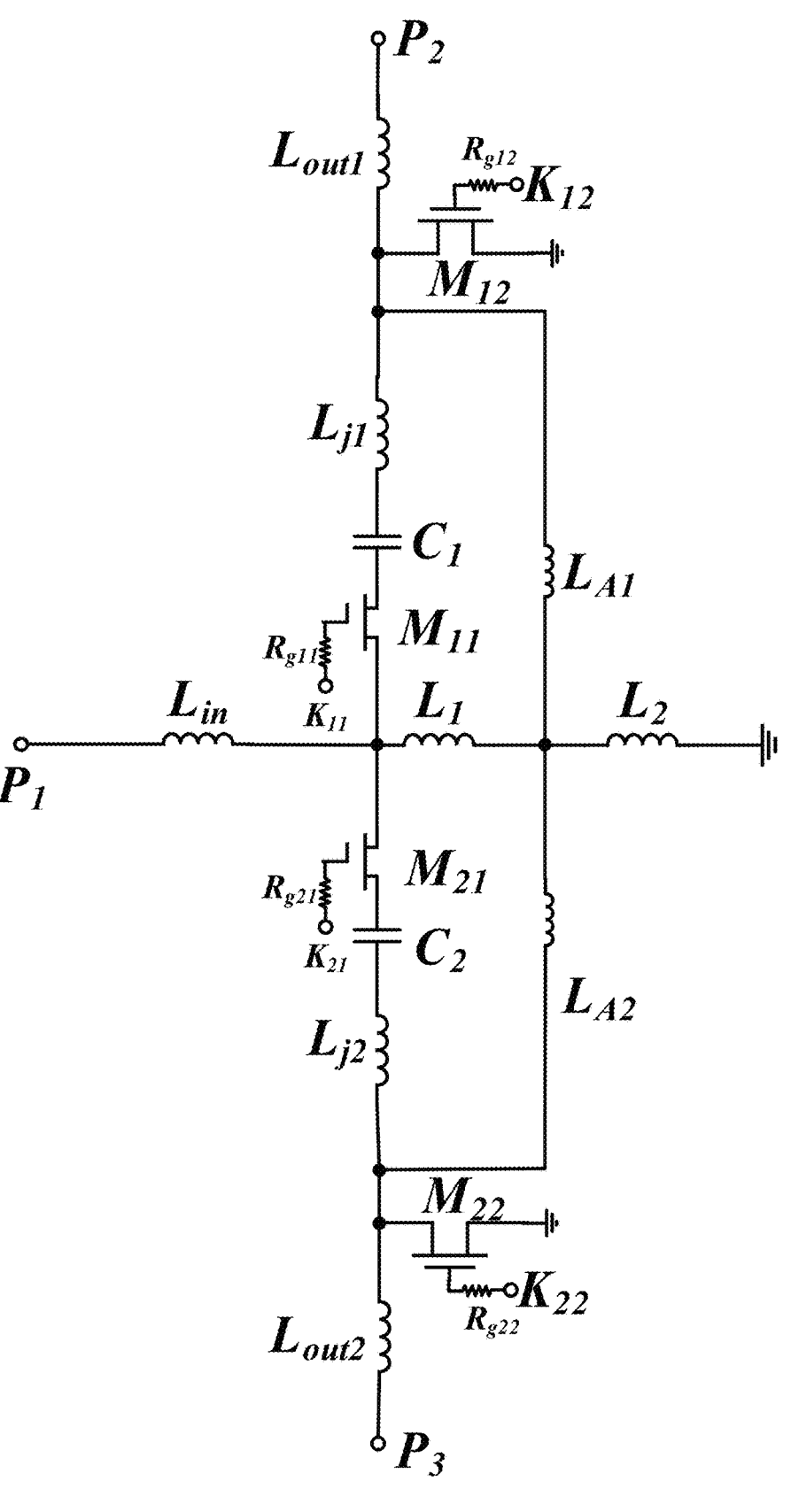
FIG. 1 is a structural diagram of the multi-inductor common-ground on-chip millimeter-wave SPDT RF switch provided in Embodiment 1 of the present invention.

The proposed multi-inductor common-ground on-chip millimeter-wave SPDT RF switch circuit proposed in this embodiment is designed based on the general circuit form shown in FIG. 5. The specific circuit structure of this RF switch is illustrated in FIG. 1. The input matching circuit $X_{in}$, the first output matching circuit $X_{out1}$, and the second output matching circuit $X_{out2}$ are respectively the input matching inductor $L_{in}$, the first output matching inductor $L_{out1}$, and the second output matching inductor $L_{out2}$. The first auxiliary matching circuit $J_1$ and the second auxiliary matching circuit $J_2$ are respectively the first auxiliary inductor $L_{j1}$ and the second auxiliary inductor $L_{j2}$. The first DC port $K_{11}$ of the first switch arm, the second DC port $K_{12}$ of the first switch arm, the first DC port $K_{21}$ of the second switch arm, and the second DC port $K_{22}$ of the second switch arm are each connected to the transistors through gate protection resistors $R_{g11}$, $R_{g12}$, $R_{g21}$, and $R_{g22}$, respectively.

Figure 6:
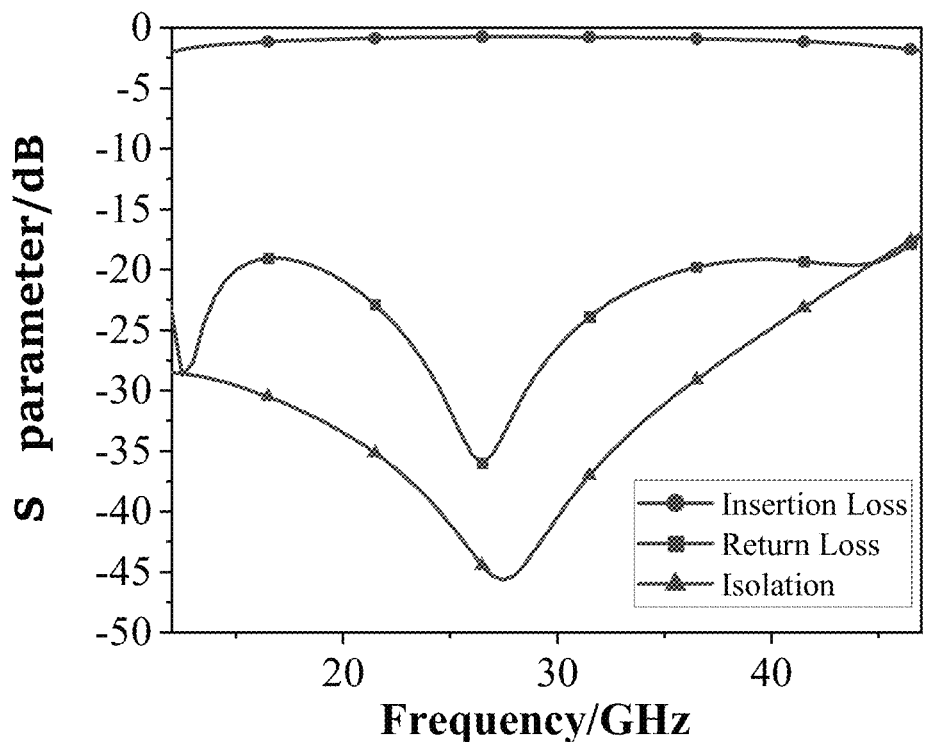
FIG. 6 shows the simulated scattering parameters versus frequency for Embodiment 1 of the present invention.

FIG. 6 shows the simulated scattering parameters versus frequency for Embodiment 1 of the present invention. As shown in FIG. 6, the SPDT switch disclosed in Embodiment 1 operates from 20-50 GHz with an insertion loss of less than 1.5 dB and a return loss greater than 20 dB.

Embodiment 2

Figure 2:
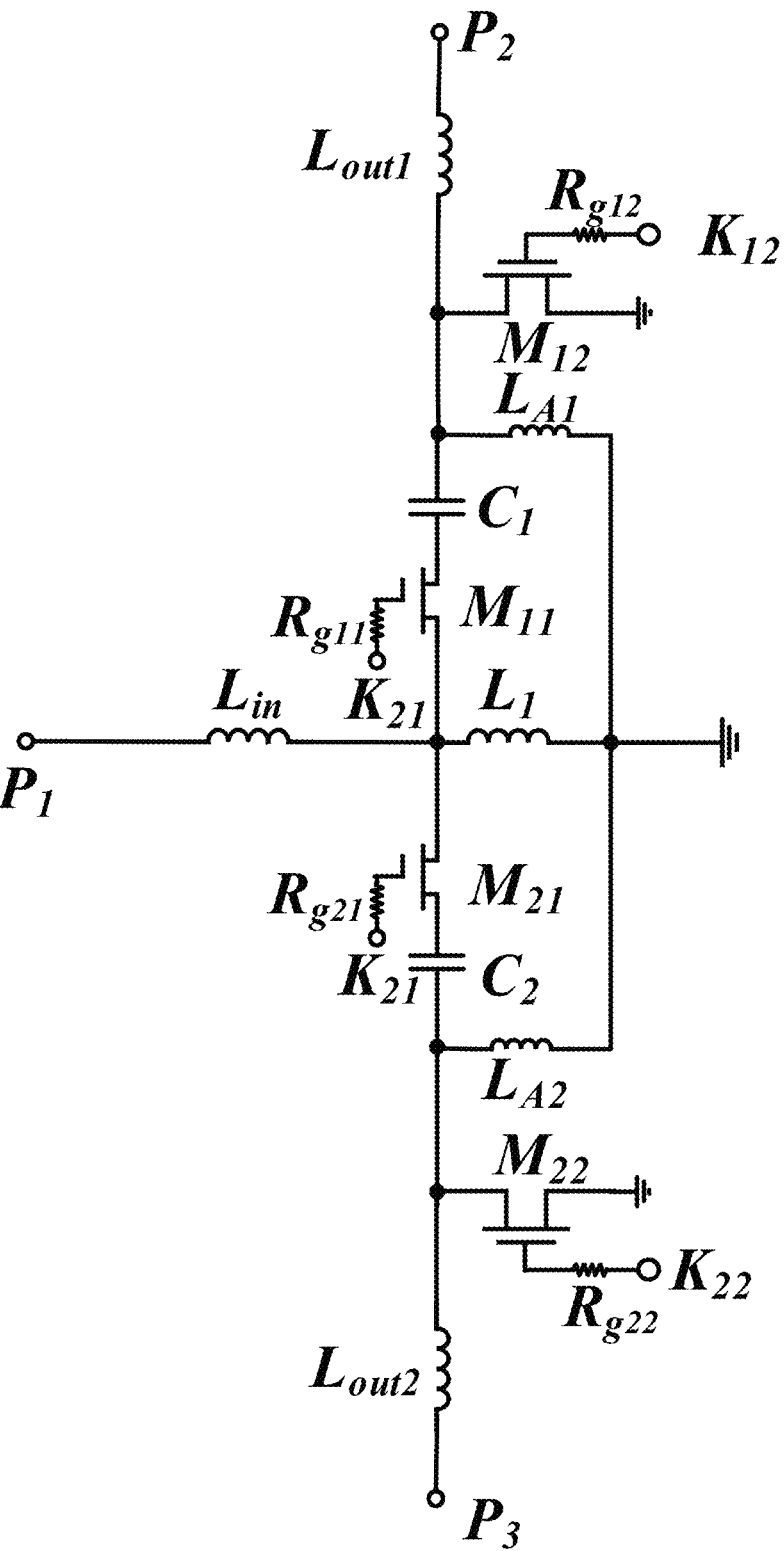
FIG. 2 is a structural diagram of the multi-inductor common-ground on-chip millimeter-wave SPDT RF switch with a direct-through auxiliary matching circuit provided in Embodiment 2 of the present invention.

Another specific implementation of the multi-inductor common-ground on-chip millimeter-wave SPDT RF switch disclosed in this invention is shown in FIG. 2. This embodiment has the same overall topology as Embodiment 1. Compared to Embodiment 1, in the on-chip millimeter-wave SPDT RF switch shown in Embodiment 2, the inductance value of the second coupled inductor $L_2$ is 0, the inductance value of the first auxiliary matching circuit $J_1$ is 0, and the inductance value of the second auxiliary matching circuit $J_2$ is 0. In this case, the first coupled inductor $L_1$, the first compensation inductor $L_{A1}$, and the second compensation inductor $L_{A2}$ share a common ground, meaning that the first coupled inductor $L_1$, the first compensation inductor $L_{A1}$, and the second compensation inductor $L_{A2}$ reuse the second coupled inductor $L_2$ to achieve a common ground, thereby realizing miniaturization of the switch.

Embodiment 3

Figure 3:
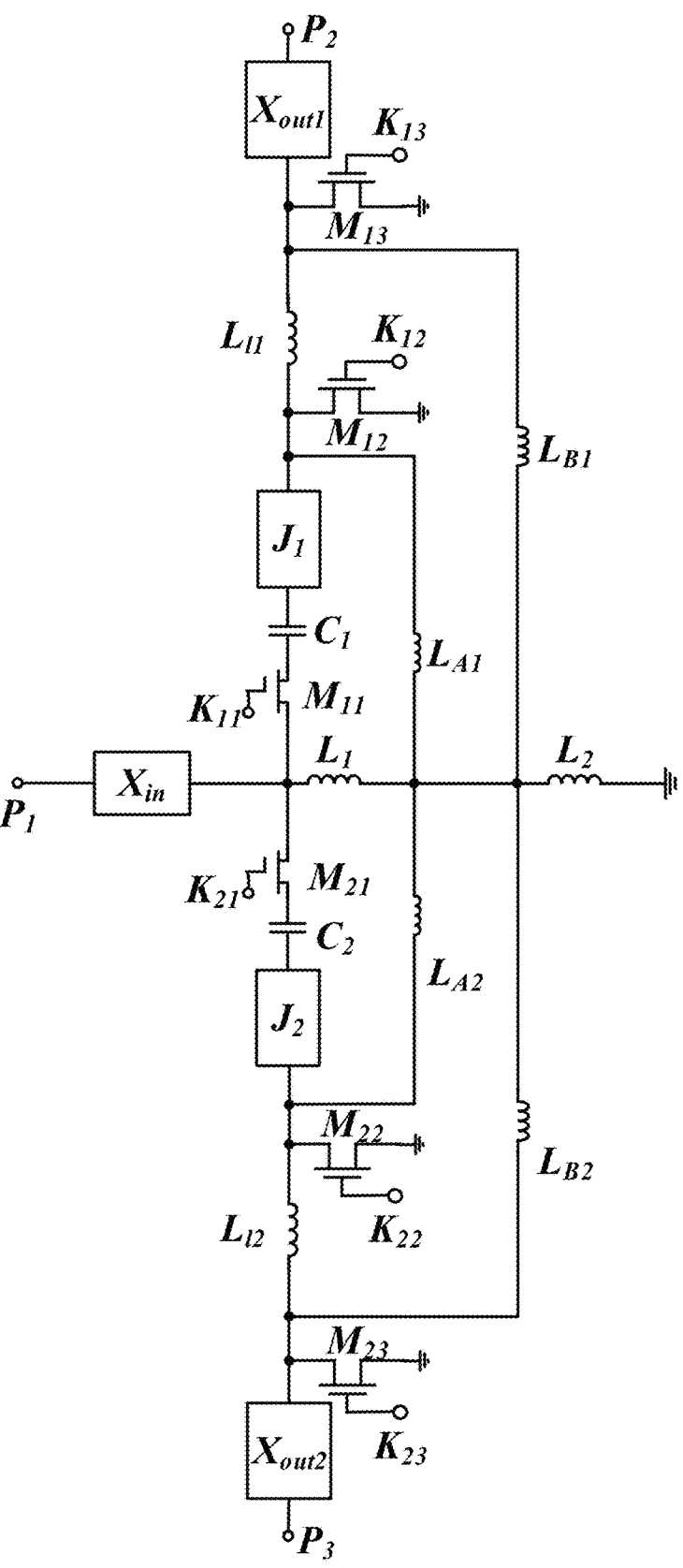
FIG. 3 is a structural diagram of the extended multi-inductor common-ground on-chip millimeter-wave SPDT RF switch provided in Embodiment 3 of the present invention.

Another specific implementation of the multi-inductor common-ground on-chip millimeter-wave SPDT RF switch disclosed in this invention is shown in FIG. 3. This embodiment extends the design of Embodiment 1 by adding a first parallel resonant unit to the first switch arm, which consists of a third transistor $M_{13}$ and a third compensation inductor $L_{B1}$, connected via a first connection inductor Lu. One end of the first connection inductor $L_1$ is connected to the second free end of the first series structure, and the other end of the first connection inductor Lai is connected to one end of the third compensation inductor $L_{B1}$ and the drain of the third transistor $M_{13}$ of the first switch arm. The other end of the third compensation inductor $L_{B1}$ is connected to the connection point between the first coupled inductor $L_1$ and the second coupled inductor $L_2$. The source of the third transistor $M_{13}$ of the first switch arm is grounded, and the gate of the third transistor $M_{13}$ of the first switch arm is connected to the third DC port $K_{13}$ of the first switch arm. Similarly, a second parallel resonant unit is added to the second switch arm, consisting of a third transistor $M_{23}$ and a fourth compensation inductor $L_{B2}$, connected via a second connection inductor $L_{12}$. One end of the second connection inductor $L_{12}$ is connected to the second free end of the second series structure, and the other end of the second connection inductor $L_{12}$ is connected to one end of the fourth compensation inductor $L_{B2}$ and the drain of the third transistor $M_{23}$ of the second switch arm. The other end of the fourth compensation inductor $L_{B2}$ is connected to the connection point between the first coupled inductor $L_1$ and the second coupled inductor $L_2$. The source of the third transistor $M_{23}$ of the second switch arm is grounded, and the gate of the third transistor $M_{23}$ of the second switch arm is connected to the third DC port $K_{23}$ of the second switch arm.

In the same switch arm, the logic levels applied to the series transistors and the parallel transistors are opposite, and all parallel transistors in the same switch arm have the same logic level. The logic levels applied to the series transistors in different switch arms are opposite, and the logic levels applied to the parallel transistors in different switch arms are also opposite. For example, when $K_{11}$ is connected to a high logic level, $K_{12}$ and $K_{13}$ are connected to a low logic level, $K_{21}$ is connected to a low logic level, and $K_{22}$ and $K_{23}$ are connected to a high logic level, the first switch arm is turned on, and the second switch arm is turned off.

Embodiment 4

Figure 4:
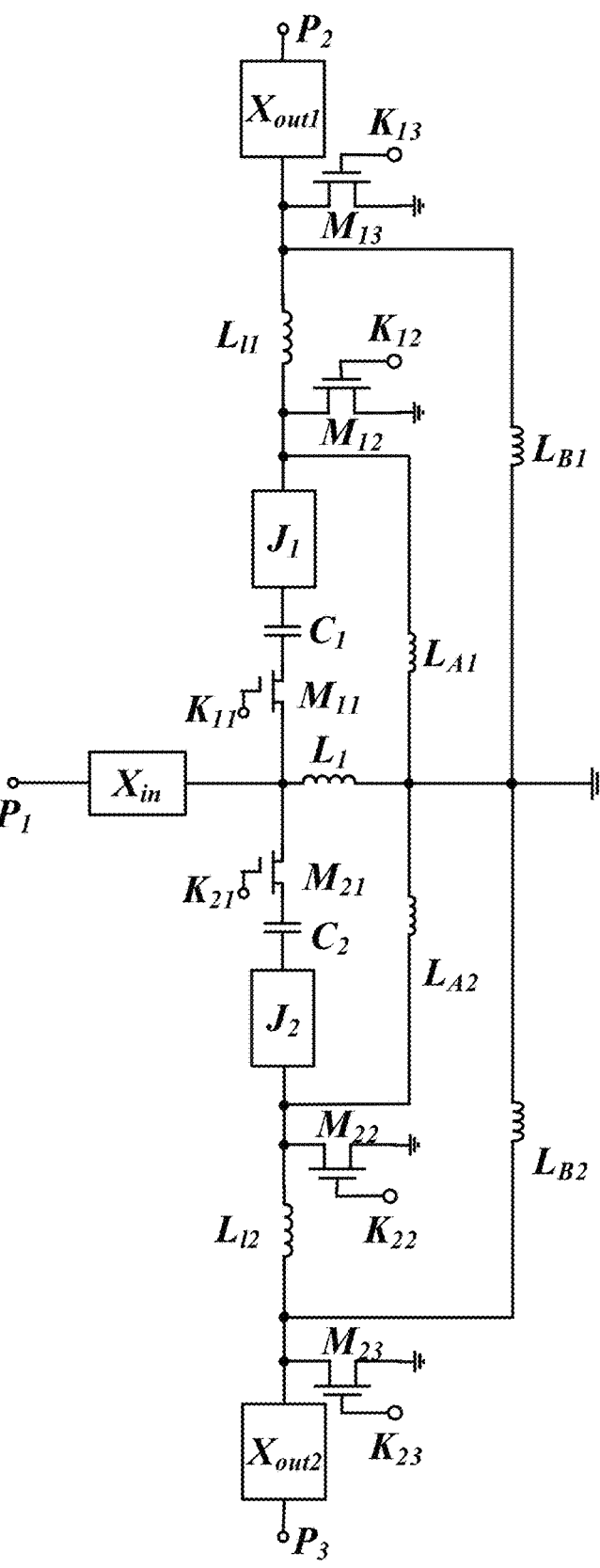
FIG. 4 is a structural diagram of a special form of the extended multi-inductor common-ground on-chip millimeter-wave SPDT RF switch provided in Embodiment 4 of the present invention.

Another specific implementation of the multi-inductor common-ground on-chip millimeter-wave SPDT RF switch disclosed in this invention is shown in FIG. 4. This embodiment is a special case of Embodiment 3, specifically where the inductance value of the second compensation inductor $L_{A2}$ in Embodiment 3 is 0.

The above embodiments are provided only to illustrate the technical ideas of this invention and should not be construed as limiting the scope of protection of this invention. Any modifications made based on the technical ideas proposed in this invention, within the framework of the technical solutions, fall within the scope of protection of this invention.

What is claimed is:

1. A multi-inductor common-ground on-chip millimeter-wave single-pole double throw (SPDT) RF switch, comprising:

a first RF port, connected to one end of an input matching circuit, with the other end of the input matching circuit connected to one end of a first coupled inductor, wherein the other end of the first coupled inductor is connected to one end of a second coupled inductor, and the other end of the second coupled inductor is grounded;

a first switch arm, including a first transistor of the first switch arm, a first coupling capacitor, a first auxiliary matching circuit, a first compensation inductor, a second transistor of the first switch arm, and a first output matching circuit, wherein the first transistor of the first switch arm, the first coupling capacitor, and the first auxiliary matching circuit are connected in series to form a first series structure, wherein a source terminal of the first transistor of the first switch arm forms a first free end of the first series structure, which serves as an input terminal of the first switch arm and is connected to the connection point between the first coupled inductor and the input matching circuit, wherein a free end of the first auxiliary matching circuit serves as a second free end of the first series structure and is electrically connected to one end of the first output matching circuit, and the other end of the first output matching circuit is the output of the first switch arm, wherein one end of the first compensation inductor is connected to the connection point between the first series structure and the first output matching circuit, and the other end of the first compensation inductor is connected to the connection point between the first coupled inductor and the second coupled inductor, wherein a drain terminal of the second transistor of the first switch arm is connected to the connection point between the first series structure and the first output matching circuit, and a source of the second transistor of the first switch arm is grounded, wherein a gate terminal of the first transistor of the first switch arm is connected to a first DC port of the first switch arm, and a gate terminal of the second transistor of the first switch arm is connected to a second DC port of the first switch arm;

a second switch arm, including a first transistor of the second switch arm, a second coupling capacitor, a second auxiliary matching circuit, a second compensation inductor, a second transistor of the second switch arm, and a second output matching circuit, wherein the first transistor of the second switch arm, the second coupling capacitor, and the second auxiliary matching circuit are connected in series to form a second series structure, wherein a drain terminal of the first transistor of the second switch arm serves as the first free end of the second series structure, which is an input terminal of the second switch arm and is connected to the connection point between the first coupled inductor and the input matching circuit, wherein a free end of the second auxiliary matching circuit serves as a second free end of the second series structure and is electrically connected to one end of the second output matching circuit, and the other end of the second output matching circuit is the output of the second switch arm, wherein one end of the second compensation inductor is connected to the connection point between the second series structure and the second output matching circuit, and the other end of the second compensation inductor is connected to the connection point between the first coupled inductor and the second coupled inductor, wherein a drain terminal of the second transistor of the second switch arm is connected to the connection point between the second series structure and the second output matching circuit, and a source of the second transistor of the second switch arm is grounded, wherein a gate terminal of the first transistor of the second switch arm is connected to a first DC port of the second switch arm, and a gate terminal of the second transistor of the second switch arm is connected to a second DC port of the second switch arm, wherein a logic level applied to the first DC port of the first switch arm is opposite to a logic level applied to the second DC port of the first switch arm, and a logic level applied to the first DC port of the second switch arm is opposite to a logic level applied to the second DC port of the second switch arm, wherein the logic level applied to the first DC port of the first switch arm is opposite to the logic level applied to the first DC port of the second switch arm, and the logic level applied to the second DC port of the first switch arm is opposite to the logic level applied to the second DC port of the second switch arm;

a second RF port, connected to an output terminal of the first switch arm; and a third RF port, connected to an output terminal of the second switch arm.

2. The multi-inductor common-ground on-chip millimeter-wave SPDT RF switch according to claim 1, wherein when an inductance value of the second coupled inductor is 0, the first coupled inductor, the first compensation inductor, and the second compensation inductor share a common ground.

3. The multi-inductor common-ground on-chip millimeter-wave SPDT RF switch according to claim 1, wherein the first switch arm further includes a first connection inductor, a third transistor of the first switch arm, and a third compensation inductor forming a first parallel resonant unit, wherein one end of the first connection inductor is connected to the second free end of the first series structure, and the other end of the first connection inductor is connected to one end of the third compensation inductor and a drain terminal of the third transistor of the first switch arm, wherein the other end of the third compensation inductor is connected to a connection point between the first coupled inductor and the second coupled inductor, wherein a source terminal of the third transistor of the first switch arm is grounded, and a gate terminal of the third transistor of the first switch arm is connected to the third DC port of the first switch arm, wherein a logic level applied to the third DC port of the first switch arm is the same as the logic level applied to the second DC port of the first switch arm, wherein the second switch arm includes a second parallel resonant unit that is symmetric to a circuit structure of the first parallel resonant unit.

4. The multi-inductor common-ground on-chip millimeter-wave SPDT RF switch according to claim 1, wherein the DC ports are connected to a DC bias voltage through gate resistors.

5. The multi-inductor common-ground on-chip millimeter-wave SPDT RF switch according to claim 1, wherein the input matching circuit, the first auxiliary matching circuit, the second auxiliary matching circuit, the first output matching circuit, and the second output matching circuit are matching circuits composed of pure inductors, pure capacitors, or a combination of capacitors and inductors.

6. The multi-inductor common-ground on-chip millimeter-wave SPDT RF switch according to claim 1, wherein the first transistor and the second transistor are field-effect transistors or high electron mobility transistors (HEMT) or mHEMT or pHEMT transistors, wherein the first input coupling inductor, the first parallel resonant unit inductor, the second parallel resonant unit inductor, the inductor in the input matching circuit, the inductor in the first output matching circuit, the inductor in the second output matching circuit, and the resonant inductor in the bandwidth expanding branch are microstrip line inductors or strip line inductors or spiral inductors.

7. The multi-inductor common-ground on-chip millimeter-wave SPDT RF switch according to claim 1, wherein the source terminals of the first transistor and the second transistor are connected to ground, and grounding of the coupled inductors are implemented through metallized via holes for grounding.

8. The multi-inductor common-ground on-chip millimeter-wave SPDT RF switch according to claim 5, wherein the first coupled inductor, the second coupled inductor, the first compensation inductor, the second compensation inductor, the third compensation inductor, the first connection inductor, the second connection inductor, the inductors in the input matching circuit, the inductors in the first auxiliary matching circuit, the inductors in the second auxiliary matching circuit, the inductors in the first output matching circuit, and the inductors in the second output matching circuit are microstrip inductors, strip line inductors, or spiral inductors.

9. The multi-inductor common-ground on-chip millimeter-wave SPDT RF switch according to claim 5, wherein the first coupling capacitor, the second coupling capacitor, the capacitors in the input matching circuit, the capacitors in the first auxiliary matching circuit, the capacitors in the second auxiliary matching circuit, the capacitors in the first output matching circuit, and the capacitors in the second output matching circuit are microstrip capacitors, metal-insulatormetal (MIM) capacitors, metal-oxide-metal (MOM) capacitors, parallel-plate capacitors, or interdigital capacitors.

10. A millimeter-wave RF front-end chip, comprising the multi-inductor common-ground on-chip millimeter-wave SPDT RF switch according to claim 1.

* * * * *